United States Patent
Ong et al.

(10) Patent No.: US 7,404,117 B2
(45) Date of Patent: Jul. 22, 2008

(54) COMPONENT TESTING AND RECOVERY

(75) Inventors: Adrian E. Ong, Pleasanton, CA (US); Richard G. Egan, San Carlos, CA (US)

(73) Assignee: Inapac Technology, Inc., San Jose, CA (US)

( * ) Notice: Subject to any disclaimer, the term of this patent is extended or adjusted under 35 U.S.C. 154(b) by 0 days.

(21) Appl. No.: 11/258,484

(22) Filed: Oct. 24, 2005

(65) Prior Publication Data

US 2007/0094555 A1    Apr. 26, 2007

(51) Int. Cl.
G11C 29/00 (2006.01)
G01R 31/02 (2006.01)
G01R 31/26 (2006.01)

(52) U.S. Cl. .................. 714/718; 324/759; 324/765; 365/201

(58) Field of Classification Search .................. 714/718; 324/359
See application file for complete search history.

(56) References Cited

U.S. PATENT DOCUMENTS

| | | | |
|---|---|---|---|
| 5,528,539 A | 6/1996 | Ong et al. | |
| 5,594,694 A | 1/1997 | Roohparvar et al. | |
| 5,677,884 A | 10/1997 | Zagar et al. | |
| 5,761,145 A | 6/1998 | Zagar et al. | |
| 5,825,697 A * | 10/1998 | Gilliam et al. | ............... 365/200 |
| 5,838,620 A | 11/1998 | Zagar et al. | |
| 5,912,579 A | 6/1999 | Zagar et al. | |
| 5,970,008 A | 10/1999 | Zagar et al. | |
| 6,097,647 A | 8/2000 | Zagar et al. | |
| 6,104,645 A | 8/2000 | Ong et al. | |
| 6,191,603 B1 | 2/2001 | Muradali et al. | |
| 6,205,082 B1 | 3/2001 | Tomita et al. | |
| 6,208,568 B1 | 3/2001 | Zagar et al. | |
| 6,216,240 B1 | 4/2001 | Won et al. | |
| 6,351,681 B1 | 2/2002 | Chih et al. | |
| 6,365,421 B2 * | 4/2002 | Debenham et al. | ............. 438/14 |
| 6,366,487 B1 | 4/2002 | Yeom | |
| 6,445,625 B1 | 9/2002 | Abedifard | |
| 6,457,141 B1 | 9/2002 | Kim et al. | |
| 6,492,727 B2 | 12/2002 | Nishizawa et al. | |
| 6,519,171 B2 | 2/2003 | Matsuzaki et al. | |
| 6,531,339 B2 * | 3/2003 | King et al. | .................. 438/110 |

(Continued)

OTHER PUBLICATIONS

U.S. Appl. No. 11/552,944, Adrian Ong, Integrated Circuit Testing Module Configured for Set-up and Hold Time Testing, filed Oct. 25, 2006.

(Continued)

*Primary Examiner*—Jacques Louis-Jacques
*Assistant Examiner*—John J Tabone, Jr.
(74) *Attorney, Agent, or Firm*—Carr & Ferrell LLP

(57) ABSTRACT

Disclosed are systems and methods of producing electronic devices. These electronic devices include excess circuits to be used as replacements for circuits that are found to be defective within the electronic device. The excess circuits are included in a different device component than the circuits that are found to be defective. The replacement process occurs after the excess circuits and defective circuits are included in an electronic device including the different device components. Identification of the defective circuits may occur before or after the defective circuits are incorporated in the electronic device. In some embodiments, systems and methods of the invention result in improved manufacturing yields as compared with the prior art.

12 Claims, 7 Drawing Sheets

U.S. PATENT DOCUMENTS

| | | | |
|---|---|---|---|
| 6,711,042 B2 | 3/2004 | Ishikawa | |
| 6,732,304 B1 * | 5/2004 | Ong | 714/718 |
| 6,812,726 B1 | 11/2004 | Ong | |
| 6,825,683 B1 | 11/2004 | Berndt et al. | |
| 6,882,171 B2 | 4/2005 | Ong | |
| 6,967,397 B2 | 11/2005 | Inoue et al. | |
| 6,996,745 B1 | 2/2006 | Shaylor | |
| 7,006,940 B1 | 2/2006 | Ong | |
| 7,053,470 B1 * | 5/2006 | Sellers et al. | 257/678 |
| 7,061,263 B1 | 6/2006 | Ong | |
| 7,075,175 B2 * | 7/2006 | Kazi et al. | 257/678 |
| 7,133,798 B1 | 11/2006 | Ong | |
| 7,139,204 B1 | 11/2006 | Behera | |
| 7,139,945 B2 | 11/2006 | Ong | |
| 7,149,135 B2 * | 12/2006 | Okuno | 365/200 |
| 7,269,765 B1 * | 9/2007 | Charlton et al. | 714/710 |
| 7,305,595 B2 * | 12/2007 | Goodwin et al. | 714/718 |
| 2004/0100296 A1 | 5/2004 | Ong | |
| 2004/0150089 A1 | 8/2004 | Inoue et al. | |
| 2004/0196709 A1 | 10/2004 | Ong | |
| 2005/0023656 A1 | 2/2005 | Leedy | |
| 2005/0024977 A1 | 2/2005 | Ong | |
| 2005/0204223 A1 | 9/2005 | Ong | |
| 2005/0204230 A1 | 9/2005 | Nilson | |
| 2005/0289428 A1 | 12/2005 | Ong | |
| 2006/0152241 A1 | 7/2006 | Ong | |

OTHER PUBLICATIONS

U.S. Appl. No. 11/552,938, Adrian Ong, Integrated Circuit Testing Module Including Signal Shaping Interface, filed Oct. 25, 2006.

U.S. Appl. No. 11/538,799, Adrian Ong, Testing and Recovery in a Multilayer Device, filed Oct. 4, 2006.

U.S. Appl. No. 11/480,234, Adrian Ong, Delay Lock Loop Delay Adjusting Method and Apparatus, filed Jun. 30, 2006.

U.S. Appl. No. 11/479,061, Adrian Ong, Integrated Circuit Test Array Including Test Module, filed Jun. 30, 2006.

U.S. Appl. No. 11/472,016, Adrian Ong, Shared memory bus architecture for system with processor and memory units, filed Jun. 20, 2006.

U.S. Appl. No. 11/443,872, Adrian Ong, Integrated Circuit Testing Module Including Command Driver, filed May 30, 2006.

U.S. Appl. No. 11/370,795, Adrian Ong, Integrated Circuit Testing Module Including Address Generator, filed Mar. 7, 2006.

U.S. Appl. No. 11/370,769, Adrian Ong, Integrated Circuit Testing Module Including Data Generator, filed Mar. 7, 2006.

U.S. Appl. No. 11/369,878, Adrian Ong, Integrated Circuit Testing Module Including Data Compression, filed Mar. 6, 2006.

U.S. Appl. No. 11/304,445, Adrian Ong, Integrated circuit testing module, filed Dec. 14, 2005.

U.S. Appl. No. 11/223,286, Adrian Ong, Shared bond pad for testing a memory within a packaged semiconductor device, filed Sep. 9, 2005.

U.S. Appl. No. 11/208,099, Adrian Ong, A Processor Memory Unit for Use in System-in-Package and System-in-Module Devices, filed Aug. 18, 2005.

U.S. Appl. No. 11/207,665, Adrian Ong, Electronic device having an interface supported testing mode, filed Aug. 18, 2005.

U.S. Appl. No. 11/207,518, Adrian Ong, Architecture and method for testing of an integrated circuit device, filed Aug. 19, 2005.

U.S. Appl. No. 11/108,385, Adrian Ong, Bonding Pads for Testing of a Semiconductor Device, filed Apr. 18, 2005.

U.S. Appl. No. 11/083,473, Adrian Ong, Internally Generating Patterns for Testing in an Integrated Circuit Device, filed Mar. 18, 2005.

U.S. Appl. No. 10/877,687, Adrian Ong, Multiple Power Levels for a Chip Within a Multi-Chip Semiconductor Package, filed Jun. 25, 2004.

U.S. Appl. No. 10/205,883, Adrian Ong, Internally generating patterns for testing in an integrated circuit device, filed Jul. 25, 2002.

U.S. Appl. No. 09/681,053, Kolluru, Mahadev S., Embedded memory architecture for video applications, filed Dec. 12, 2000.

U.S. Appl. No. 11/744,815, Adrian Ong, Integrated Circuit Testing Module Including Multiplexed Inputs, filed May 4, 2007.

* cited by examiner

COMPONENT TESTING AND RECOVERY

CROSS-REFERENCE TO RELATED APPLICATIONS

This application is related to co-pending U.S. patent application Ser. No. 11/108,385, filed on Apr. 18, 2005, entitled "Bonding pads for testing of a semiconductor device," which is a divisional of U.S. Pat. No. 6,882,171 filed on Jun. 27, 2003 and entitled "Bonding pads for testing of a semiconductor device," which is a continuation-in-part of U.S. Pat. No. 6,812,726, filed on Nov. 27, 2002, entitled "Entering test mode and accessing of a packaged semiconductor device." This application is also related to co-pending U.S. patent application Ser. No. 10/679,673, filed on Oct. 3, 2003, entitled "Set up for a first integrated circuit chip to allow for testing of a co-packaged second integrated circuit chip," and to U.S. patent application Ser. No. 11/207,665, filed on Aug. 18, 2005, entitled "Electronic device having an interface supported testing mode." This application is also related to co-pending U.S. patent application Ser. No. 11/223,286, filed on Sep. 9, 2005, entitled "Shared Bond Pad for Testing a Memory within a Packaged Semiconductor Device." The disclosures of all of the above U.S. patents and patent applications are incorporated by reference herein.

BACKGROUND

1. Field of the Invention

The invention is in the field of electronics and more specifically in the fields of integrated circuit testing and assembly.

2. Related Art

In order to meet the needs and demands of advanced applications, electronic devices are becoming increasingly complex. This complexity makes it difficult and expensive to design single integrated circuits from scratch for specific applications. One approach to meeting the needs of specific applications, while avoiding the use of complex single integrated circuits, is to assemble a set of discrete components into a single package. These discrete components may be a set of previously designed circuits assembled as a system-on-chip (SoC), e.g., a system of discrete circuits on a single semiconductor die, a single system-in-package (SiP), a single system-in-module (SiM), a package-in-package (PoP), or the like.

A disadvantage of generating a single electronic device from a set of discrete components is that the failure rate of the entire device is the product of the failure rate of each of the components. Once discrete components are assembled into a single electronic device, any failure can result in the loss of the entire electronic device. Thus, if a memory component has a five percent failure rate, an electronic device having four of these memory components will have at least an 18 percent failure rate. This aggregated failure rate can be very expensive.

There are systems for testing and repairing individual device components prior to assembly into a single system. For example, circuits can be tested at the wafer lever, before the wafer on which they are produced is cut. They may also be repaired using laser fuses or anti-fuse technology. These repairs involve the use of excess circuits within the same individual device component as replacements for defective circuits. However, these systems cannot detect failures related to the assembly process, and the inclusion of excess circuits within the same individual device component can be costly. There is, therefore, a need for improved systems and methods of testing and/or increasing the yield of multi-component devices.

SUMMARY

Various embodiments of the invention include systems and methods for increasing the manufacturing yield of electronic devices including more than one device component. These electronic devices are typically embodied in an electronic device package and may include, for example, system-in-package (SiP), system-on-chip (SoC), system-in-module (SiM) systems, or package-in-package (PoP) systems. Manufacturing yield may be increased by identifying defects within individual device components and, through various approaches, compensating for the identified defects. For example, in some embodiments, the locations of circuits including defects are identified in a memory component, e.g., a component including memory cells, and these locations are stored using fuses included in the memory component. These fuses may later be read in order to configure other device components packaged along with the memory component, such that the defects are avoided or replaced. In some embodiments, the locations of the identified circuits including defects are stored elsewhere, such as in a database.

The stored information regarding the location of defective circuits is optionally used to substitute excess memory circuits for those memory circuits including defects. In contrast with the prior art, the excess memory circuits can be external to the memory component including the circuits being replaced. For example, the excess memory circuits may be in another device component included within the same electronic device package. Thus, in some embodiments, a memory component may be used in an electronic device, even when the memory component itself does not have sufficient excess memory circuits to replace all those that are defective.

The excess memory, or other types of excess circuitry, configured for use as a substitute, may be disposed within a variety of component device types, within the same electronic device. For example, in some embodiments, this excess memory is included in a processor, an application specific integrated circuit (ASIC), another memory circuit, an interface, or the like.

Various embodiments of the invention further include an interface included in an electronic device and configured to facilitate testing of other device components within the electronic device and/or configured for communication between various device components within the electronic device package. For example, some embodiments include an interface configured to operate in a normal mode in which the interface is used for communication between an ASIC and a memory component, or between an ASIC and an external electrical connector, and a test mode in which the interface is used for testing the memory component. Either the ASIC or the interface optionally includes the excess memory configured for replacing memory in the memory component found to be defective through the testing processes. In some embodiments, the interface is included within the memory component.

In some embodiments, the interface is configured for testing and repair of an assembled electronic device using anti-fuse technology. For example, in some embodiments, a shared electrical connector electronically coupled to the interface is used to access a memory component. Through the interface, the shared electrical connector may be used to access the memory component in one mode, and to access a different device component in another mode. Thus, access to the memory component after assembly of the electronic devices can be achieved without dedicated electrical connectors configured for testing of the memory component. In various embodiments, this access is used for testing and/or repair of the memory component.

While, for the purposes of illustration, some of the examples herein use memory circuits to illustrate embodiments of the invention, the examples presented are intended to apply to other types of circuits as would be apparent to one skilled in the art. These other types of circuits include, for example, signal processing circuits, analog circuits, sensors, clock circuits, processors, ASICs, logic circuits, or the like.

Various embodiments of the invention include a system comprising a first device component including a plurality of circuits, a second device component including excess circuits configurable to replace one or more of the plurality of circuits of the first device component, electronic device packaging incorporating the first device component and the second device component, and an electrical connector configured to receive programming instructions, the programming instructions being responsive to test data generated through testing of the first device component and being configured for replacing the one or more of the plurality of circuits with the excess circuits, the test data including an identity of a defective circuit within the plurality of circuits.

Various embodiments of the invention include a method comprising using a testing device to generate test results configured to identify one or more circuits including defects, the one or more circuits being disposed within a first device component, storing the test results, incorporating the first device component in an electronic device following the generation of the test results, incorporating a second device component within the electronic device, the second device component including one or more substitute circuits, and configuring the electronic device to replace the one or more circuits identified as including defects with the one or more excess circuits using the test results.

Various embodiments of the invention include a method comprising using a testing device to generate first test results data configured to identify one or more circuits including defects, the one or more circuits being disposed within a first device component and the testing occurring prior to incorporation of the first device component within an electronic device, and storing the first test results data, the first test results data being configured for replacing some of the one or more circuits including defects with excess circuits, the excess circuits being disposed within a second device component configured for incorporation within the electronic device.

Various embodiments of the invention include a system comprising means for identifying one or more circuits including defects, the one or more circuits being disposed within a first device component, means for storing information identifying the one or more circuits including defects prior to incorporation of the first device, component into an electronic device, means for reading the information stored, following incorporating the first device component into the electronic device, and means for programming the electronic device in order to compensate for the defects using the information read.

DETAILED DESCRIPTION

Figure 1:
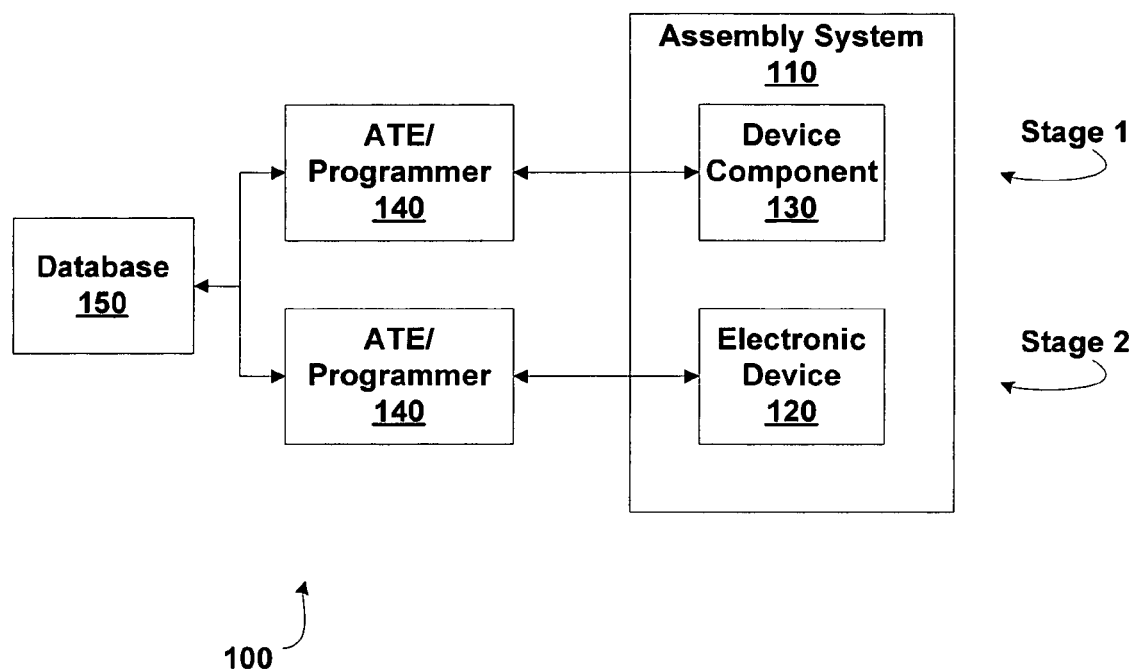
FIG. 1 illustrates an electronic device manufacturing system, according to various embodiments of the invention.

Various embodiments of the invention include systems for and methods of manufacturing an electronic device having a plurality of device components. The systems for manufacturing may include, for example, device components, assembly systems, data systems, programming equipment and test equipment. The assembly systems are configured for incorporating the device components into electronic device packaging to form the electronic device.

The assembled electronic device includes an excess of one or more circuit types. For example, in some embodiments, the device components include an excess of memory circuits. As is described further herein, the excess of memory circuits are used as replacements for any memory circuits determined to be defective using the test equipment. The excess memory circuits are optionally disposed within a different device component than the defective circuits they are configurable to replace. In alternative embodiments, the excess circuits may include logic circuits, sensors, data processing circuits, timing circuits, signal processing circuits, transducers, or the like.

The assembled device components optionally further include elements configured for storing data identifying which circuits are found to be defective. For example, in some embodiments, a memory component includes fuses configured for storing data identifying defective memory circuits within that memory component. Alternative embodiments include a data system, external to the electronic device, configured for storing the data identifying which circuits are found to be defective.

The stored information is optionally used, after the device component has been incorporated in an electronic device, to reconfigure the electronic device such that the excess circuits are used to compensate for the defective circuits. In some embodiments, the use of excess circuits, as substitutes for those found to be defective, advantageously increases the yield of the manufacturing process.

Various embodiments of the invention include the manufactured electronic device wherein excess circuitry in one device component has been used to replace circuitry, of another device component, found to be defective. The electronic device can include, for example, an application specific integrated circuit (ASIC), a microprocessor, a microcontroller, a digital signal processor (DSP), a field programmable gate array (FPGA), a programmable logic device (PLD), complex programmable logic device (CPLD), a sensor, an analog-to-digital converter, an analog signal processor, a digital signal processor and/or other electronic circuits. The electronic device can further include memory, such as static random access memory (SRAM), dynamic random access memory (DRAM), synchronous DRAM (SDRAM), non-volatile random access memory (NVRAM), and read only memory (ROM), erasable programmable ROM (EPROM), electrically erasable programmable ROM (EEPROM), flash memory, or the like. In various embodiments, the excess circuitry is configurable for replacement of all or part of any of the above electronic device components.

The electronic device can include various surface mount technologies such as a single in-line package (SIP), dual in-line package (DIP), zig-zag in-line package (ZIP), plastic leaded chip carrier (PLCC), small outline package (SOP), thin SOP (TSOP), flatpack, and quad flatpack (QFP), or the like. These packages can utilize various leads (e.g., J-lead, gull-wing lead or BGA type connectors).

As is further described herein, testing of the various electronic device components may occur at a variety of times during the manufacturing (e.g., assembly) process. For example, in various embodiments, testing occurs at the wafer level prior to inclusion of a device component in the electronic device package, and then again after the device component is incorporated in the electronic device and the electronic device packaging is sealed such that internal components are only accessible through a limited set of electrical connectors that pass through the electronic device packaging.

FIG. 1 illustrates an Electronic Device Manufacturing System, generally designated 100, according to various embodiments of the invention. Electronic Device Manufacturing System 100 is configured to manufacture an electronic device including at least two device components, to test the manufactured electronic device, and to make use of excess circuits in one of the device components to replace circuits determined to be defective within another of the device components within the electronic device. Electronic Device Manufacturing System 100 is optionally further configured to perform tests and/or repairs of circuits determined to be defective following assembly. For example, some embodiments of Electronic Device Manufacturing System 100 include test devices configured to test a device component through a multi-mode interface and to use anti-fuses to compensate for defects found during these tests.

Electronic Device Manufacturing System 100 includes an Assembly System 110 configured for assembling an Electronic Device 120. The assembly of Electronic Device 120 typically occurs in a series of assembly stages. For the purpose of illustration, these assembly stages can be divided into a first stage (Stage 1) wherein a Device Component 130 is tested and optionally repaired, and a second stage (Stage 2) wherein the Device Component 130 is incorporated in Electronic Device 120. These assembly stages optionally occur at different times and/or in different locations. For example, Stage 1 may include manufacture of a Device Component 130 at a first location, and Stage 2 may include incorporation of the manufactured Device Component 130 in Electronic Device 120 after the Device Component 130 has been transported to a second location. Thus, Assembly System 110 may be geographically distributed. Further details of the Assembly System 110 are discussed elsewhere herein.

Electronic Device Manufacturing System 100 further includes one or more Automated Testing Equipment/Programmer, referred to herein as ATE 140, configured to test Device Component 130 at one or more assembly stages. Test data generated using ATE 140 is optionally stored in a Database 150 for use in programming Electronic Device 120 in later stages of Assembly System 110. The programming of Electronic Device 120 can include configuring Electronic Device 120 to make use of excess circuits in order to replace or otherwise compensate for circuits within Device Component 130 that are found to be defective.

Device Component 130 may include, for example, an application specific integrated circuit (ASIC), a microprocessor, a microcontroller, a digital signal processor (DSP), a field programmable gate array (FPGA), programmable logic device (PLD), complex programmable logic device (CPLD), a sensor, an analog to digital converter, an analog signal processor, other circuit types discussed herein, and/or other circuitry. Device Component 130 may further or alternatively include memory, such as, for example, static random access memory (SRAM), dynamic random access memory (DRAM), synchronous DRAM (SDRAM), non-volatile random access memory (NVRAM), and read only memory (ROM) such as erasable programmable ROM (EPROM) or electrically erasable programmable ROM (EEPROM), flash memory, or the like.

Electronic Device 120 includes one or more instances of Device Component 130, typically within an electronic device package. Electronic Device 120 may comprise, for example, system-in-package (SiP), system-on-chip (SoC), system-in-module (SiM) package-in-package (PoP) devices, or the like. The electronic device package of Electronic Device 120 can include, for example, a single in-line package (SIP), dual in-line package (DIP), zig-zag in-line package (ZIP), plastic leaded chip carrier (PLCC), small outline package (SOP), thin SOP (TSOP), flatpack, and quad flatpack (QFP), or the like. These packages may utilize various leads (e.g., J-lead, gull-wing lead or BGA type connectors, etc.). Electronic Device 120 is optionally an embodiment of Electronic Devices 10, 50 or 900 as described in U.S. patent application Ser. No. 11/207,665, filed on Aug. 18, 2005, entitled "Electronic device having an interface supported testing mode," or Circuit 90 as described in U.S. patent application Ser. No. 11/223,286, filed on Sep. 9, 2005, entitled "Shared Bond Pad for Testing a Memory within a Packaged Semiconductor Device."

Stage 1 of Assembly System 110 is configured for manufacture, and optional testing of Device Component 130. For example, Stage 1 may include a silicon foundry for manufacture of a memory circuit on a semiconductor die. An instance of ATE 140 is optionally used to test and/or repair the manufactured device component. Stage 2 of Assembly System 110 includes equipment for mounting one or more instances of Device Component 130 within an electronic device package and finishing the electronic device packaging of Electronic Device 120. The apparatus included in Stage 2 is optionally also configured to test and/or repair the one or more instances of Device Component 130 following the mounting process using an instance of ATE 140. For example, an instance of ATE 140 included in Stage 2 is optionally configured for programming, (e.g., modifying or configuring), Electronic Device 120 such that any circuits found to be defective within Electronic Device 120 are replaced by excess circuitry within Electronic Device 120. The excess circuitry used for replacement in Stage 2 may be disposed within the tested instance of Device Component 130 or within another device component within Electronic Device 120.

FIG. 1 illustrates instances Electronic Device 120 and Device Component 130. The instance of Device Component 130 shown may, at a later time be included in the instance of Electronic Device 120. Thus, these instances may be representative of the same Electronic Device 120 or ATE 140 at different times during manufacturing, and/or representative of different instances of Electronic Device 120 or ATE 140.

Figure 2:
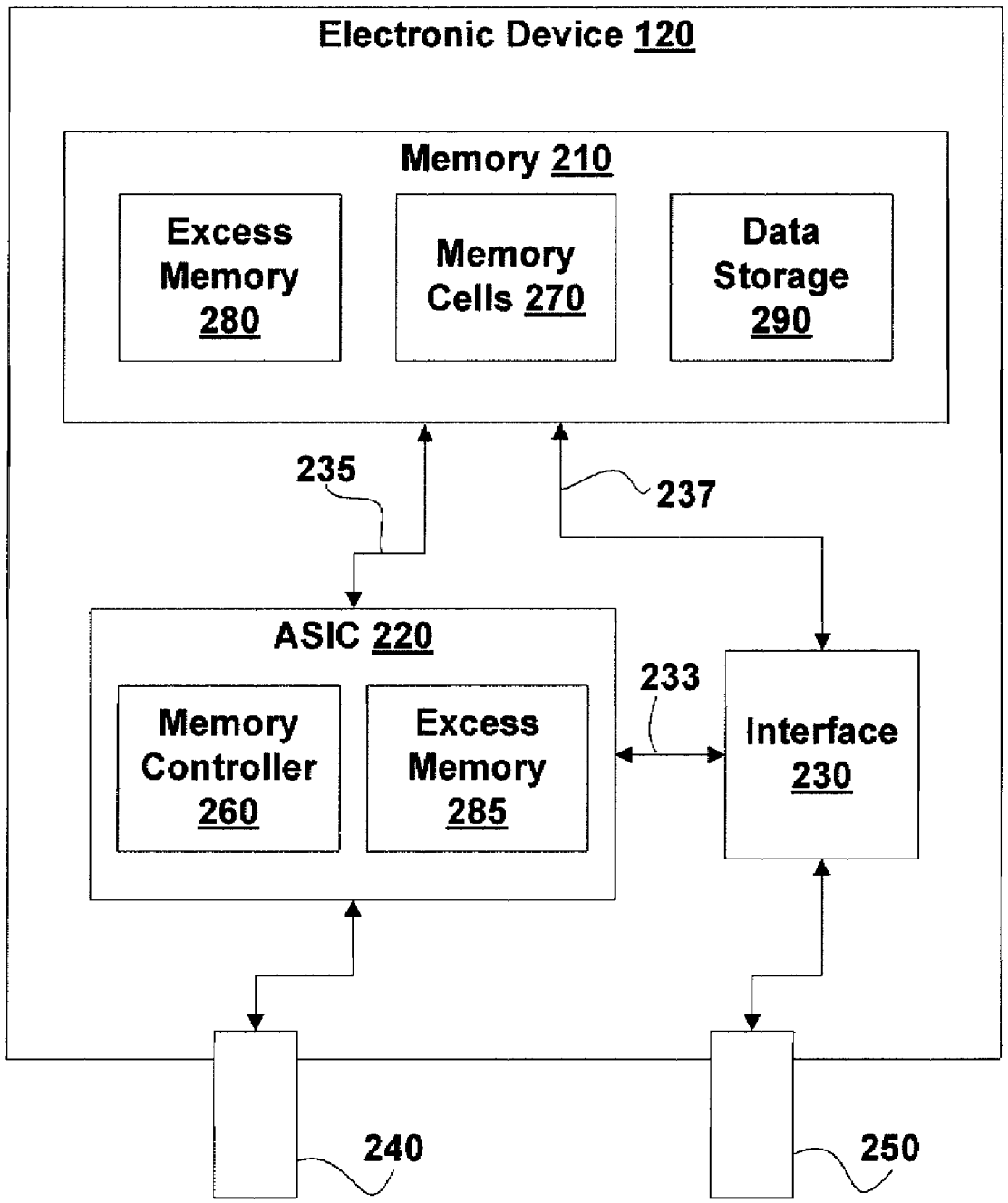
FIG. 2 illustrates an electronic device, according to various embodiments of the invention.

FIG. 2 illustrates further details of Electronic Device 120, according to various embodiments of the invention. The instances of Electronic Device 120 illustrated in FIG. 2 includes Memory 210, an ASIC 220 and an Interface 230. Memory 210, ASIC 220 and Interface 230 are configured to communicate through Communication Paths 233, 235 and 237, and are each illustrative embodiments of Device Component 130. Interface 230 is optionally included in Memory 210 or ASIC 220.

At least an Electrical Connector 240 and an Electrical Connector 250 are configured for facilitating communication between Electronic Device 120 and electronics external to Electronic Device 120. Electrical Connector 240 and Electrical Connector 250 are typically pins, bond pads, or the like. Electrical Connector 240 and Electrical Connector 250 typically extend through electronic device packaging of Electronic Device 120. In some embodiments, Electrical Connector 250 is a shared electrical connector configured for communicating data to ASIC 220 in a normal operation mode and for communicating data to Memory 210 in a test mode or a programming mode. In some embodiments, Electrical Connector 250 is a shared electrical connector as discussed in U.S. patent application Ser. Nos. 11/223,286 and 11/207,665, referenced above.

Interface 230 is configured to convey signals between Memory 210, ASIC 220 and Electrical Connector 250, responsive to an operation mode, e.g., a normal operation mode, a test mode, a programming mode, or the like. For example, in some embodiments, Interface 230 is configured for communicating signals between (e.g., to and from) Electrical Connector 250 and ASIC 220 in the normal operation mode and for communicating signals between Electrical Connector 250 and Memory 210 in the test mode. In some embodiments, Interface 230 is configured for communicating signals between ASIC 220 and Memory 210 in the normal operation mode and between Electrical Connector 250 and Memory 210 in the test mode. Interface 230 is optionally configured to receive data serially in some modes and to receive part of a parallel data communication in other modes. Interface 230 may include one or more buffers, or one or more multiplexers, configured for controlling how signals are communicated in various modes.

Memory 210 includes Memory Cells 270, optional Excess Memory 280 and optional Data Storage 290. Memory Cells 270 are configured to store digital data received from ASIC 220 or Interface 230. Excess Memory 280 is memory configurable to replace defective memory circuits within Memory Cells 270. Data Storage 290 is configured to store information identifying the locations of defective memory circuits within Memory Cells 270. For example, in some embodiments, Data Storage 290 includes a series of fuses configured to encode the identity of locations within Memory Cells 270.

ASIC 220 optionally includes a Memory Controller 260 configurable for mapping virtual memory addresses to physical memory. For example, in some embodiments, Memory Controller 260 is initially configured to map virtual memory addresses to physical memory within Memory 210 (e.g., Memory Cells 270). ASIC 220 optionally further includes Excess Memory 285. Excess Memory 285 includes memory cells configured to store digital data and to serve as substitutes for members of Memory Cells 270 that are found to be defective. Memory substitution using Excess Memory 285 can occur in Stage 2 of Assembly System 110 after Memory 210 is incorporated within Electronic Device 120.

Memory substitution using Excess Memory 285 may occur at various granularities. For example, in some embodiments memory substitution occurs at the minimum granularity at which memory is addressed, e.g., byte, word, or the like. In various embodiments, memory substitution occurs on a single bit basis, a row basis, a column basis, a segment basis, an array basis, a sub-array basis, a memory bank basis, or the like. In alternative embodiments, Excess Memory 285 is located elsewhere within Electronic Device 120. For example, Excess Memory 285 may be included in Interface 230 or some other Device Component 130.

Memory substitution is optionally accomplished by altering a memory map within Memory Controller 260. For example, Memory Controller 260 may include a memory map configured for converting virtual memory addresses to absolute (physical) memory addresses. Memory at a first physical location within Memory 210 may be replaced by memory at a second physical location within Excess Memory 280 or Excess Memory 285 by exchanging their respective physical memory addresses within the memory map. In some embodiments, memory substitution is accomplished by burning fuses within Data Storage 290. These fuses may be burned using laser light or electronic signals, or through other methods of fuse burning known in the art.

Programming of Electronic Device 120 responsive to tests made using ATE 140 may be accomplished according to several different approaches. In a first approach, programming is performed using ATE 140 at approximately the same time that tests are performed. In this approach, testing and programming may be part of the same operation. For example, ATE 140 may be placed in physical contact with Electronic Device 120 or Device Component 130, and before this physical contact is broken both testing and programming are performed. In a second approach, programming may be performed sometime after testing. For example, programming performed at assembly Stage 2 may be performed responsive to tests performed in Stage 1. In these embodiments, tests results are optionally stored in Database 150, ATE 140 or Data Storage 290 between the testing and programming procedures. In the second approach, data from tests performed at more than one assembly stage may be aggregated and used in the same programming process. For example, tests performed using instances of ATE 140 at Stage 1 and Stage 2 may each generate results that are used for programming Electronic Device 120 in Stage 2.

In some embodiments, the information regarding defective circuits includes data identifying a memory bank, a sub-array within the memory bank, and a column sector within the sub-array. In some embodiments, the information regarding defective circuits includes data identifying a memory bank, a sub-array within the memory bank, a row sector within the sub-array, and a column sector. Alternative representations are anticipated in alternative embodiments. In some embodiments, the granularity of the circuit replacement process is selected based on the probability of failure modes, e.g., single memory cells, single or double memory rows, single or double memory columns, etc. In these embodiments, the granularity of replacement is chosen to benefit assembly yield in view of available excess memory. Examples of how the information regarding defective circuits may be stored in Data Storage 190 are presented elsewhere herein.

Interface 230 is optionally configured to convey signals from Electrical Connector 250 to Memory 210 during programming of Electronic Device 120. For example, in some embodiments, Interface 230 is configured to convey signals from Electrical Connector 250 to Memory 210 for testing purposes and also programming purposes. Those signals conveyed for testing and programming purposes are optionally conveyed to different inputs of Memory 210. Testing and programming can occur in ths same mode or in separate test and programming modes. Thus, in some embodiments, Interface 230 is configured to operate in three different modes: a normal operation mode, a testing mode, and a programming mode. In the programming mode, Interface 230 is configured to convey programming signals to one or more Device Component 130 within Electronic Device 120 in order to configure the use of excess circuits as replacement circuits.

In alternative embodiments, Excess Memory 270 is included in Memory 210, ASIC 220, or another Device Component 130 within Electronic Device 120. For example, Excess Memory 270 may be included in an instance of Device Component 130 distinct from Memory 210 and ASIC 220. Likewise, in alternative embodiments, Memory Controller 260 is included in Memory 210, or some other part of Electronic Device 120.

Figure 3:
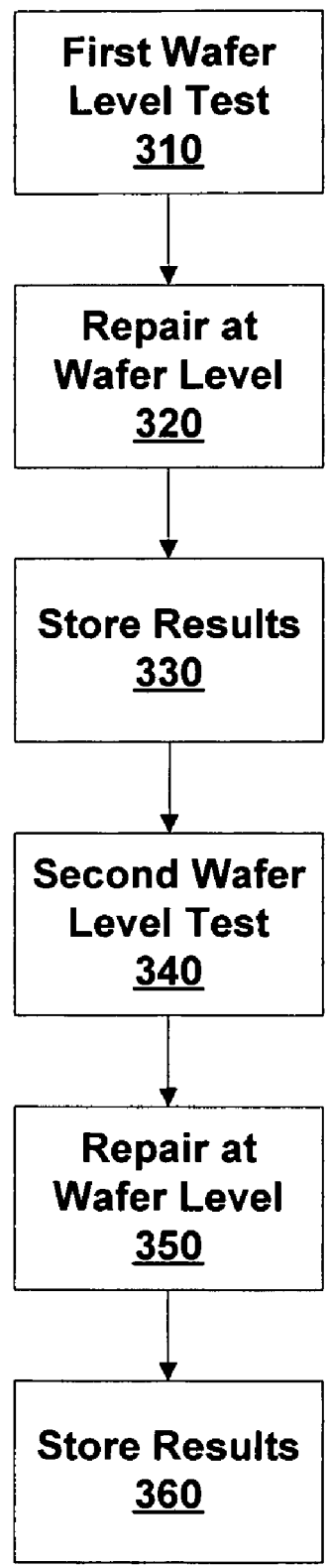
FIG. 3 illustrates methods of testing and/or repairing a circuit, according to various embodiments of the invention.

FIG. 3 illustrates methods of testing and/or repairing a Device Component 130 in Stage 1 of Assembly System 110, according to various embodiments of the invention. For example, in some embodiments, tests of Memory Cells 170 performed using ATE 140. Results from these tests are optionally used to program (e.g., reconfigure) Memory 210 such that all or part of Excess Memory 280 are used to replace defective members of Memory Cells 270. Memory 210 can be tested a second time to confirm that the replacement process was successful and/or to test Memory 210 under different conditions (e.g., at a different temperature). Tests results, generated from either testing, may be used to replace defective circuits within Memory Cells 270 with all or part of Excess Memory 280. If the test results indicate that the amount of Excess Memory 280 within Memory 210 is insufficient to replace the defective circuits, Electronic Device 120 is optionally discarded. Alternatively, the locations of unreplaced defective circuits within Memory Cells 270 are stored in Data Storage 290 or Database 150 for later use. In some embodiments, the steps illustrated in FIG. 3 may be performed without moving Electronic Device 120 or disconnecting ATE 140 from Electronic Device 120.

In a First Wafer Level Test Step 310, Device Component 130 is tested using ATE 140 prior to inclusion within Electronic Device 120 (e.g., in Stage 1 of Assembly System 110). The tested Device Component 130 may be rejected for incorporation within Electronic Device 120 if the number and/or types of defects discovered within Memory Cells 270 are above a certain predetermined level and excepted if the number of defects is equal to or below this predetermined level. The predetermined level is optionally greater than the capacity of Excess Memory 280 to replace defective circuits within Memory Cells 270.

In an optional Repair at Wafer Level Step 320, Memory 210 is repaired by replacing defective circuits identified in First Wafer Level Test Step 310 with all or part of Excess Memory 280. In some embodiments, these repairs are made using laser based techniques. In some embodiments, these repairs are made using anti-fuse technology. The number of defects within Memory Cells 270 that can be repaired in Repair at Wafer Level Step 320 is limited by the number of replacement circuits available within Excess Memory 280.

In a Store Results Step 330, the identities of any members of Memory Cells 270 found to be defective in First Wafer Level Test Step 310, but not replaced using Excess Memory 280 in Repair at Wafer Level Step 320, are stored. This storage may occur in Database 150 and/or Data Storage 290. In some embodiments, fuses are used to store the identities in Data Storage 290. Methods of encoding the identities of members of Memory Cells 270 using fuses are described elsewhere herein. In some embodiments, the stored information is configured to identify memory, e.g., cells, bytes, words, rows, columns, segments, banks, etc., within Memory 210 that include one or more defective memory cells.

When the identities are stored in Database 150, they are stored in association with the particular instance of Memory 210 tested such that they can be retrieved after that instance of Memory 210 is incorporated in Electronic Device 120. Database 150 is optionally configured to store test results for a plurality of Devices Components 130.

In an optional Second Wafer Level Test Step 340, Memory 210 is tested using ATE 140. These tests are similar to those of First Wafer Level Test Step 310. However, Second Wafer Level Test Step 340 may be performed under different circumstances, for example at a different temperature. Further, in Second Wafer Level Test Step 340 those circuits within Memory Cells 270 previously identified as being defective need not be tested again. Following Second Wafer Level Test Step 340, if it is determined that the number of defects within Memory Cells 270 is greater than may be replaced using Excess Memory 280 and Excess Memory 285, then the tested instance of Memory 210 may be discarded.

In an optional Repair at Wafer Level Step 350, any members of Memory Cells 270 found to be defective in Second Wafer Level Test Step 340 are replaced using Excess Memory 280. The replacement process may be similar to that discussed above with respect to Repair at Wafer Level Step 320.

In an optional Store Results Step 360, the identities of any members of Memory Cells 270 found to be defective in Second Wafer Level Test 340 and not repaired in Repair at Wafer Level Step 350 are stored. Storage may occur in Database 150 and/or Data Storage 290. The identities stored in Store Results Step 330 and Store Results Step 360 are configured to be used to replace members of Memory Cells 270 using excess memory external to Memory 210, e.g., Excess Memory 285.

Figure 4:
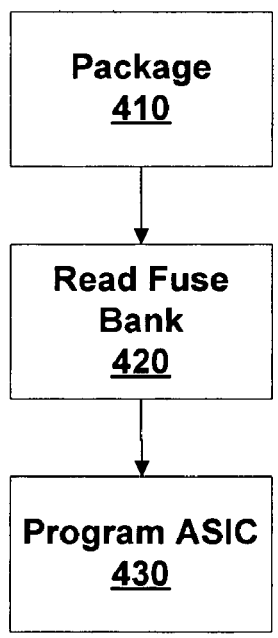
FIG. 4 illustrates methods of compensating for defective circuits in an electronic device, according to various embodiments of the invention.

FIG. 4 illustrates methods of compensating for defective circuits in Electronic Device 120 in Stage 2 of Assembly system 110. In these methods, the instance of Device Component 130 tested in the methods illustrated by FIG. 3 is incorporated within an instance of Electronic Device 120. The identities of defective circuits stored in Store Results Step 230 or 260 are read and used to reconfigure the instance of Electronic Device 120 to compensate for these defects. For example, Electronic Device 120 may be programmed to use Excess Memory 285 as a substitute for defective members of Memory Cells 270.

In a Package Step 410, Memory 210 is incorporated within Electronic Device 120. In some embodiments, incorporation includes mounting of Device Component 130 within a packaging of Electronic Device 120 and/or establishment of electrical connections between electrical connectors of Device Component 130 and electrical connectors of Electronic Device 120 (e.g., Electrical Connectors 240 or 250). Electronic Device 120 also includes further instances of Device Component 130, for example, as illustrated in FIG. 2. These further instances are optionally also incorporated within Electronic Device 120 in Package Step 410. Package Step 410 typically includes finishing (e.g., closing) of the packaging of Electronic Device 120.

In a Read Fuse Bank Step 420, the identities of any defective circuits within Memory Cells 270, that are not already replaced using Excess Memory 280, are read from Data Storage 290 or Database 150. In some embodiments, this information is read from Data Storage 290 through Interface 230 and shared Electrical Connector 250. In these embodiments, Interface 230 is placed in a read/test mode by sending an appropriate signal to Interface 230. In the read/test mode, Interface 230 is configured to convey signals from Electrical Connector 250 to Memory 210 rather than from Electrical Connector 250 to ASIC 220. Further details of switching Electronic Device 120 to read/test mode (e.g., test mode), according to some embodiments, are discussed in U.S. patent application Ser. Nos. 11/207,665 and 11/223,286. The identities are optionally read using an instance of ATE 140.

In a Program ASIC Step 430, the identities read in Read Fuse Bank Step 420 are used to program (e.g., configure) Electronic Device 120 such that Excess Memory 285 is used as replacements for circuits within Memory Cells 270 found to be defective. Programming may include configuration of Memory Controller 260, burning of fuses, or the like. In some embodiments, programming is performed using an instance of ATE 140. Instances of ATE 140 configured for reading Data Storage 290 and/or programming ASIC 220 are optionally not configured for testing Memory 210 or Electronic Device 120 or vice versa.

Figure 5:
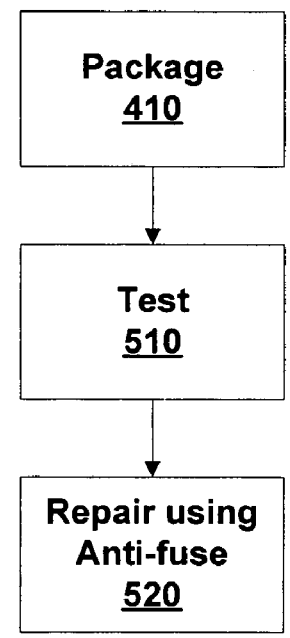
FIG. 5 illustrates methods of compensating for defective circuits in an electronic device, according to various embodiments of the invention.

FIG. 5 illustrates methods of compensating for defective circuits in an electronic device, such as Electronic Device 120, in Stage 2 of Assembly System 110. Following packaging, the electronic device is tested using ATE 140 via shared Electrical Connector 250 and Interface 230. In various embodiments, this testing may be used to confirm the success of repairs made in Repair at Wafer Level Step 350 and/or to detect defects resulting from packaging of Device Component 130 in Electronic Device 120.

Testing of Electronic Device 120 takes place in a Test Step 510. Test Step 510 typically occurs when Memory 210 is no longer directly accessible to ATE 140. In this case, testing is performed via Electrical Connector 240, Electrical Connector 250 and/or other electrical connectors disposed to convey signals between device components within Electronic Device 120 and systems external to Electronic Device 120. The testing of Memory 210 using shared Electrical Connector 250 and Interface 230, according to some embodiments, is further described in U.S. patent application Ser. No. 11/207,665, filed on Aug. 18, 2005, entitled "Electronic device having an interface supported testing mode," or Circuit 90 as described in U.S. patent application Ser. No. 11/223,286, filed on Sep. 9, 2005, entitled "Shared Bond Pad for Testing a Memory within a Packaged Semiconductor Device."

In an optional Repair Using Anti-fuse Step 520, any defects within Memory 210 identified in Test Step 510 are repaired using anti-fuse technology. These repairs are optionally made using ATE 140. As in Test Step 510, in some embodiments, communication between Memory 210 and ATE 140 is passed through Interface 230 and shared Electrical Connector 250. In these embodiments, Interface 230 is first placed in a program mode similar to the test/program mode (e.g., test mode) discussed in U.S. patent application Ser. Nos. 11/207,665 and 11/223,286. In alternative embodiments, Repair Using Anti-fuse Step 520 includes programming of Memory Controller 260 using commands sent to ASIC 220 rather than the use of anti-fuse technology within Memory 210. Repair Using Anti-Fuse Step 520 may only be possible when there is available Excess Memory 280.

Figure 6:
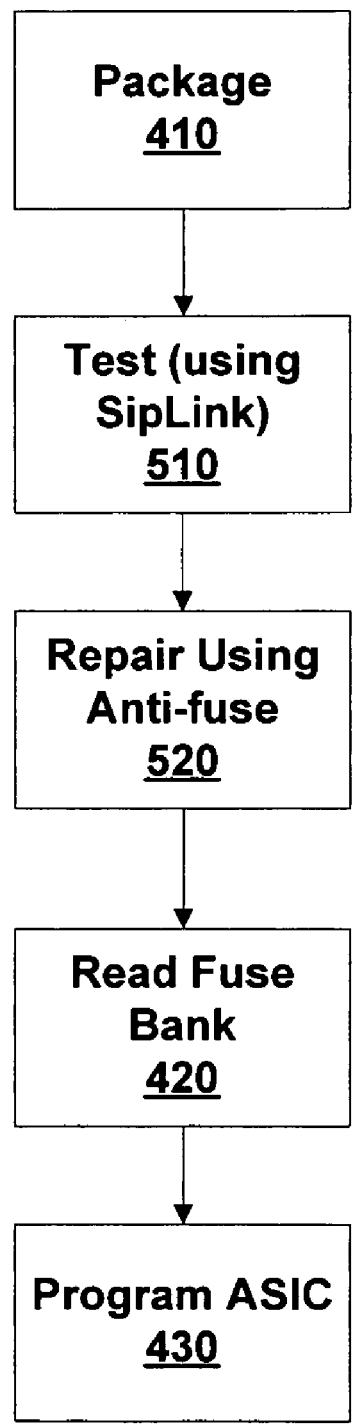
FIG. 6 illustrates combined methods of compensating for defective circuits, according to various embodiments of the invention.

FIG. 6 illustrates combined methods of compensating for defective circuits. These methods include combinations of steps illustrated in FIGS. 4 and 5. These steps may be performed in a variety of orders. For example, in contrast with FIG. 6, Steps 420 and/or 430 may be performed prior to Steps 510 and 520.

Figure 7A:
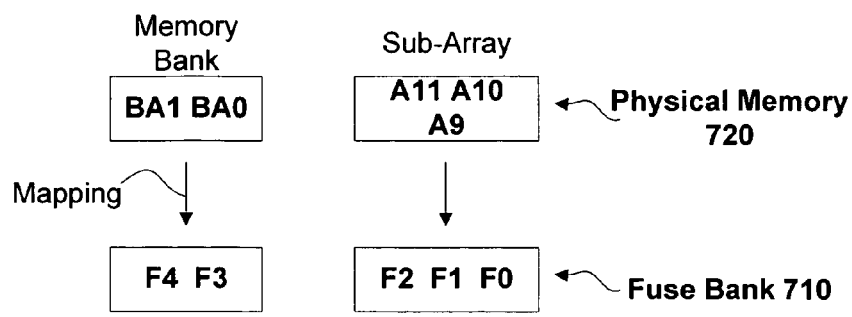
FIGS. 7A and 7B illustrate mappings of defective circuits to a fuse bank, according to various embodiments of the invention.
Figure 7B:
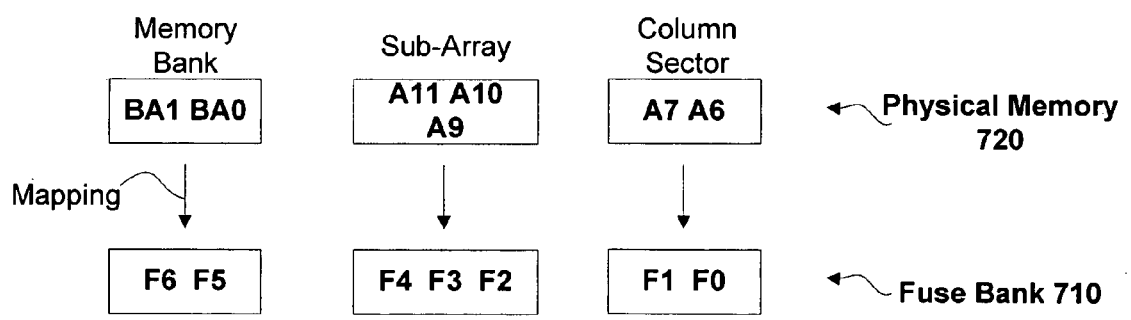

FIGS. 7A and 7B illustrate approaches to mapping defective circuits within Memory 210 to Data Storage 290, in embodiments where Data Storage 290 includes a Fuse Bank 710. FIGS. 7A and 7B differ in the granularity of the circuits identified.

In embodiments illustrated by FIG. 7A, two fuses (F4 and F3) are used to identify a specific memory bank within Physical Memory 720 of Memory Cells 270, and three fuses (F2, F1 and F0) are used to identify a specific Sub-Array within the identified memory bank. For example, in some embodiments, dynamic random access memory (DRAM) architecture is divided into multiples of sub-array segments surrounded by bit-line sense-amps and row decoders. Each sub-array segment is optionally decoded by row addresses A11, A10, and A9. Each of these row addresses, in turn, addresses 8 sub-array blocks in a bank or sub bank depending on the memory density. In these embodiments, a total of 512 rows may be included within a sub-array segment. These rows are identified using row addresses A8-A0.

The embodiment of Fuse Bank 710 shown in FIG. 7A includes five fuses F6-F0. These fuses are optionally based on DRAM laser fuse technology. To identify bank 2, sub-array 5 as a sector including defects, a laser fuse bit pattern of 10101 may be used, where a blown fuse indicates a logical "0."

FIG. 7B illustrates a mapping of Physical Memory 720 to an embodiment of Fuse Bank 710 having greater granularity than the embodiments illustrated in FIG. 7A. In the embodiments illustrated by FIG. 7B, 7 fuses are used and a partial row may be identified. This mapping is configurable, for example, to identify 64 columns (¼ of 256 columns) on a 512-row sub-array (assuming a 256-column address configuration and a 512 row per sub-array segment architecture).

Figure 8A:
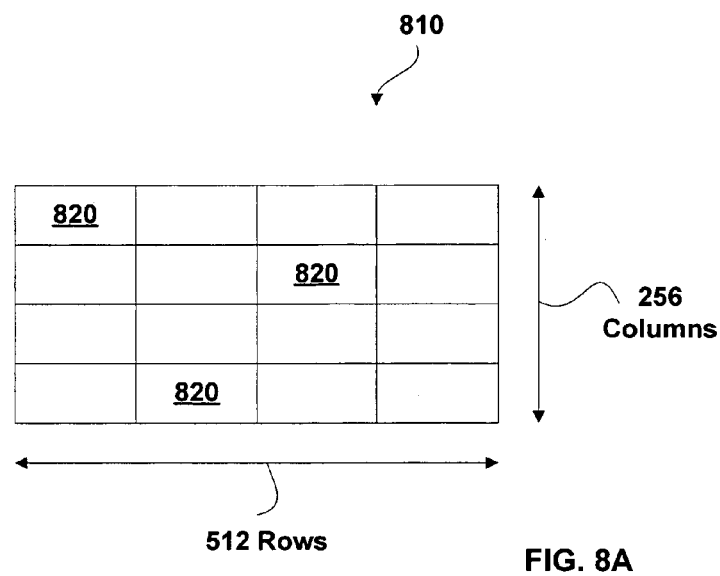
FIG. 8A illustrates a memory tiling.
Figure 8B:
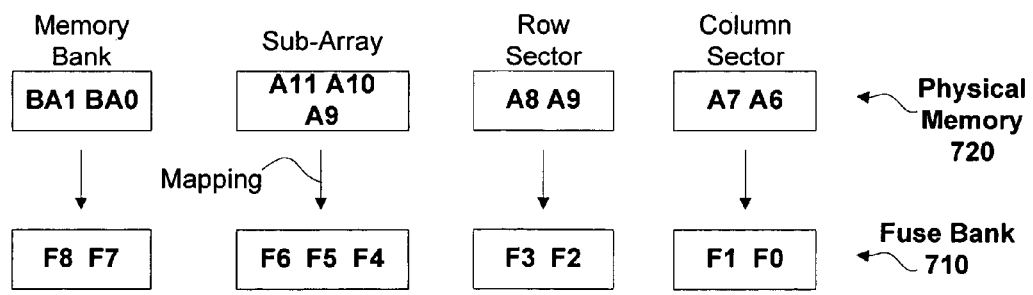
FIG. 8B illustrates mappings of defective circuits to a fuse bank, according to various alternative embodiments of the invention.

FIGS. 8A and 8B illustrate alternative embodiments of identifying members of Memory Cells 270 including defects using Fuse Bank 710 included in Data Storage 290. The illustrated approaches are based on a tile structure within a memory bank. FIG. 8A illustrates a 512-row by 256-column Sub-array Segment, generally designated 810, divided into 16 Tiles 820 each including 128 rows by 64 columns. Alternative, embodiments of Tiles 820 may include different numbers of rows and columns. For example, one embodiment includes 4 rows and 256 columns, and one embodiment includes 128 rows and 8 columns.

FIG. 8B illustrates a mapping of Physical Memory 720 to an instance of Fuse Bank 710 including 9 fuses. The number of banks in a DRAM architecture defines the number of bank sector bits (e.g., fuses required to identify a specific bank). In the illustrated example, two fuses are used to uniquely identify four banks, three fuses are used to uniquely identify a sub-array, such as Sub-Array Segment 810, and two fuses each are used to identify row sectors and column sectors.

Typically, Data Storage 290 includes an instance of Fuse Bank 710 for every defect to be replaced within Memory Cells 270. For example, in an instance of Electronic Device 120 having a capacity to replace four defects using Excess Memory 285 would include four instances of Fuse Bank 710. In various embodiments, the total number of fuses in Data Storage 290 is greater than or equal to 16, 24, 32, 40, 60 or 120 fuses. While FIGS. 7A, 7B, 8A and 8B illustrate some possible mapping schemes, it is anticipated that other mapping schemes are possible and are within the scope of the invention.

Several embodiments are specifically illustrated and/or described herein. However, it will be appreciated that modifications and variations are covered by the above teachings and within the scope of the appended claims without departing from the spirit and intended scope thereof. For example, those device components used herein for the purpose of example, e.g., Memory 210 and ASIC 220, may be replaced by other types of circuits in alternative embodiments of the invention. Interface 230 is optionally included in other device components within Electronic Device 120. The systems and methods described herein are equally applicable to devices including optical components. Thus, as used herein, terms such as electronic device and electronic connector may be read to include optical devices and optical connectors configured to perform similar functions as their electronic counterparts. In some embodiments, excess circuits are used for implementation of expanded functionality of Electronic Device 120, rather than or in addition to compensation for defective circuits. In some embodiments excess circuits in one device component are configurable for replacing defective circuits in a plurality of other device components within the same electronic device. For example, excess memory circuits within an ASIC may be used to replace defective memory circuits in two different memory components at the same time. In some embodiments, fuses are replaced by static memory or other non-volatile memory.

The embodiments discussed herein are illustrative of the present invention. As these embodiments of the present invention are described with reference to illustrations, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

What is claimed is:

1. A system comprising:
   a first device component including a plurality of circuits configured for storing test data generated through testing of the first device component, the test data including an identity of a defective circuit within the first device;
   a second device component including an excess circuit configurable to replace the defective circuit of the first device component;
   a third device component configured for reading the test data stored in the first device component and replacing the defective circuit with the excess circuit; and
   an electronic device packaging incorporating the first device component, the second device component, and the third device component.

2. The system of claim 1, wherein the test data is stored in the first device component prior to incorporation of the first device component in the electronic device packaging.

3. The system of claim 1, wherein the third device component is further configured to read the test data after incorporation of the third device component in the electronic device packaging.

4. The system of claim 1, wherein the first device component includes a memory component.

5. The system of claim 1, wherein the second device component includes an ASIC.

6. The system of claim 5, wherein the ASIC includes a memory controller configured to receive computing instructions configured for replacing the defective circuit with the excess circuit.

7. The system of claim 1 wherein the third device component includes an interface coupled to an external connector shared by the first device component and the second device component.

8. A method comprising:
   testing a first device component to generate test data, the first device component including a plurality of circuits;
   storing the test data in one or more of the plurality of circuits, the test data including an identity of a defective circuit within the plurality of circuits;
   incorporating the first device component in an electronic device packaging after storing the test data;
   incorporating a second device component in the electronic device packaging, the second device component including an excess circuit configurable to replace the defective circuit of the first device component; and
   reading the test data stored in the first device component and substituting the excess circuit for the defective circuit using the read test data.

9. The method of claim 8, further comprising incorporating a third device component in the electronic device, the third device component configured to read the test data stored in the first device component.

10. The method of claim 9, wherein third device component is further configured for programming the second device component to substitute the excess circuit for the defective circuit using the read test data.

11. The method of claim 8, wherein the first device component is incorporated into the electronic device at a different time than the second device component.

12. The method of claim 8, further comprising testing the first device component after substituting the excess circuit for the defective circuit and using results of the further testing to another excess circuit for another defective circuit in the first device component.

* * * * *